United States Patent [19]

Asplund et al.

[11] 4,377,835
[45] Mar. 22, 1983

[54] RECOVERY PROTECTION DEVICE FOR A THYRISTOR VALVE

[75] Inventors: Gunnar Asplund; Lars Eklund, both of Ludvika; Bernt Östlund, Västeras, all of Sweden

[73] Assignee: ASEA Aktiebolag, Västeras, Sweden

[21] Appl. No.: 278,020

[22] Filed: Jun. 29, 1981

[30] Foreign Application Priority Data

Jul. 7, 1980 [SE] Sweden .................................. 8004989

[51] Int. Cl.³ ............................................. H02H 7/127
[52] U.S. Cl. ........................................ 361/91; 361/86; 361/89; 361/100; 363/54; 363/57
[58] Field of Search ...................... 361/100, 89, 84, 82, 361/91, 88, 86; 363/54, 57, 50, 58; 307/252 M

[56] References Cited

U.S. PATENT DOCUMENTS

| | | | |
|---|---|---|---|
| 3,487,261 | 12/1969 | Boksjo et al. | 363/54 X |
| 3,865,438 | 2/1975 | Boksjo et al. | 363/54 |
| 4,084,206 | 4/1978 | Leowald et al. | 363/54 X |
| 4,084,221 | 4/1978 | Ogata | 363/54 |
| 4,313,156 | 1/1982 | Kobayashi et al. | 363/54 |

Primary Examiner—Patrick R. Salce
Attorney, Agent, or Firm—Pollock, Vande Sande & Priddy

[57] ABSTRACT

In a thyristor valve having a plurality of series-connected thyristors, each thyristor has an individual recovery protection device arranged in its entirety at the potential of the thyristor. For each thyristor, the protection device comprises a voltage-sensing member whch indicates the point of time when the thyristor takes up reverse blocking voltage. A time-determining member defines a certain time interval, counting from said point of time. Control members are arranged to deliver a control pulse for firing the thyristor if the off-state voltage of the thyristor during the time interval exceeds a predetermined value.

2 Claims, 3 Drawing Figures

RECOVERY PROTECTION DEVICE FOR A THYRISTOR VALVE

TECHNICAL FIELD

This invention relates to a recovery protection device for a thyristor valve having a plurality of series-connected thyristors, the device being of the kind which, for each thyristor, comprises a first voltage-sensing member arranged to determine the point of time when, after a conducting interval of the thyristor, its reverse blocking voltage exceeds a first predetermined value, time-determining means arranged to define a time interval starting at said point of time and with a predetermined length, and control means arranged to deliver a firing signal to the thyristor if its off-state voltage during said time interval exceeds a second predetermined value.

BACKGROUND ART

During a certain time, the so-called recovery time, after the end of the current-carrying interval of a thyristor, the ability of the thyristor to take up off-state voltage is reduced. If it is then subjected to too high an off-state voltage, there is a risk of the thyristor being self-ignited, which may lead to the thyristor being damaged or destroyed. To avoid this risk it is known to use a recovery protection device of the kind referred to above. Such a protection device is known for example, from U.S. Pat. No. 4,084,206. This protection device has one portion positioned at earth potential. To transmit signals between this portion and the control circuits arranged at thyristor potential, there are required two potential separating transmission channels for each thyristor. A typical high-voltage thyristor valve has a large number of series-connected thyristors and therefore the number of necessary transmission channels is large. This has two considerable disadvantages. First of all the great number of transmission channels results in the valve becoming complicated and more expensive. Secondly, it involves a reduction of the reliability of operation of the valve. This reduction is not insignificant since the optoelectronic components (light-emitting diodes) included in a typical transmission channel have a lower reliability and a lower life than the other components included in the control circuits of the valve.

In the known recovery protection device, the protection device is restored by the next ordinary control pulse from the pulse device of the valve. This means that the protection device may be activated only a single time each period, and this fact is a considerable drawback in certain operating cases.

The invention aims to provide a recovery protection device of the kind referred to above, which does not require any potential-separating transmission channels and therefore renders the valve less complicated, resulting in a lower price and a higher reliability in operation. Further, the invention aims to provide a recovery protection device which is ready for operation immediately after having been activated.

DISCLOSURE OF INVENTION

According to the invention, in a thyristor valve having a plurality of series-connected thyristors, there is provided an individual recovery protection device for each of said thyristors, each of said recovery protection devices being in its entirety at the potential of its associated thyristor and comprising a first voltage-sensing member determining the point of time when, after a conducting interval of the thyristor, its reverse blocking voltage exceeds a first predetermined value, time-determining means defining a time interval starting at said point of time and with a predetermined length, and control means for delivering an ignition signal to the thyristor if its off-state voltage during said time interval exceeds a second predetermined value.

BRIEF DESCRIPTION OF DRAWINGS

The invention will now be described, by way of example, with reference to the accompanying drawings, in which.

DESCRIPTION OF PREFERRED EMBODIMENT

Figure 1:
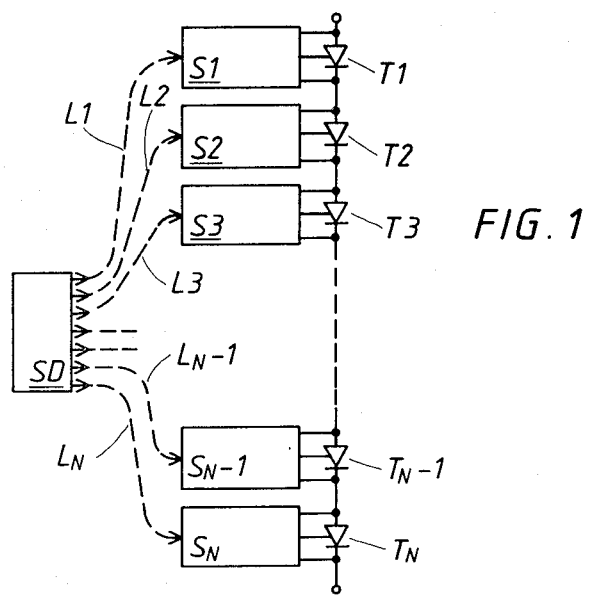
FIG. 1 is a schematic circuit diagram of a thyristor valve with a recovery protection device according to the invention.

FIG. 1 shows a thyristor valve, for example for use in a converter for high voltage direct current transmission, having series-connected thyristors $T1, T2, \ldots T_N$. Each thyristor is provided with a respective control unit $S1, S2, \ldots S_N$ connected to the anode, cathode and control gate of the thyristor, which control unit is thus at the same potential as the thyristor. A control device SD common for the valve is arranged to deliver ignition signals to the thyristors for simultaneous ignition of the thyristors of the valve, for example for phase angle control of the converter in which the valve is included. These "ordinary" ignition signals are transmitted to the thyristors via potential-separating transmission channels $L1, L2, \ldots L_N$. These may suitably consist of light-emitting diodes, light conductors and light detectors. The control device SD then delivers ignition signals in the form of light pulses which are transmitted to the control units, where they are detected by light-sensitive elements and cause ignition of the thyristors.

Figure 2:
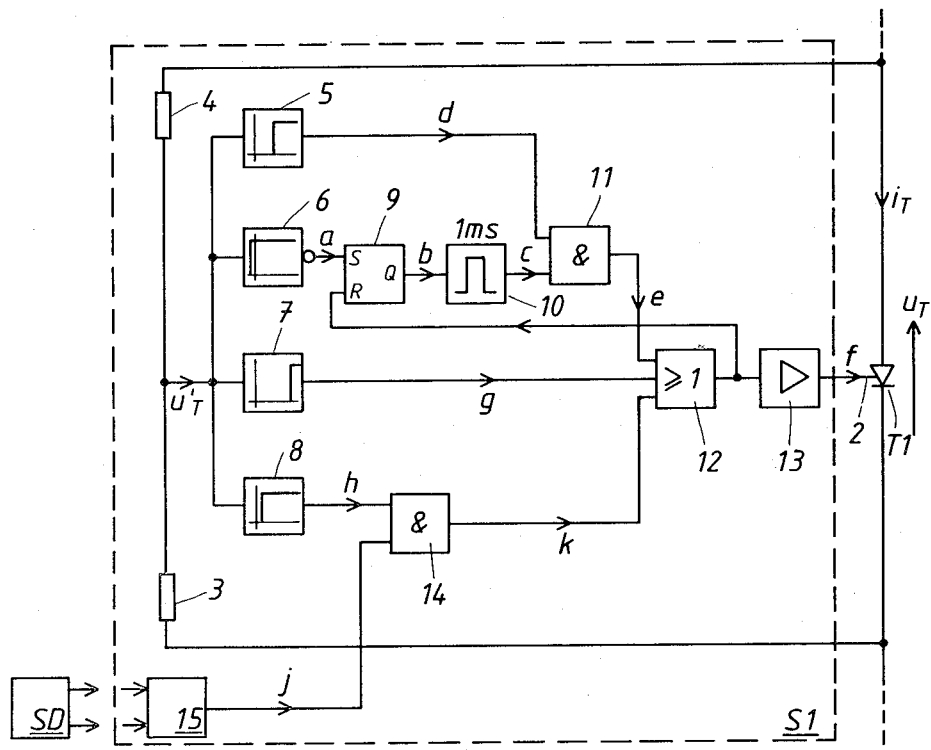
FIG. 2 is a circuit diagram of one of the thyristors of the valve of FIG. 1 with its associated control unit.

FIG. 2 shows the thyristor T1 of FIG. 1 and its associated control unit S1. The control units $S2, S3, \ldots S_N$ of the other thyristors $T2, T3, \ldots T_N$ are designed and connected in the same way as shown in FIG. 2. A voltage divider is connected in parallel with the thyristor and consists of resistors 3 and 4. From the voltage divider a signal $u'_T$ is obtained which is proportional to the thyristor voltage $u_T$. A level detector 5 delivers an output signal d, which is "1" if $u_T$ exceeds a certain positive value, for example 1 kV. If the off-state voltage of the thyristor exceeds 1 kV, the signal d therefore becomes "1". A level detector 6 delivers a signal a, which is "1" if $u_T$ is lower than a certain negative value, for example $-10$ V. If the reverse blocking voltage of the thyristor exceeds 10 V, the signal a therefore becomes "1". The signal a indicates that the thyristor has ceased carrying current and that reverse blocking voltage has been applied thereon. This signal is supplied to a bistable flip-flop 9 which, when the signal a becomes "1", is set to the position where its output signal b is "1". The signal b is supplied to a monostable flip-flop 10 which, when the output signal b becomes "1", delivers a pulse c of a length of, for example, 1 ms. The pulse c and the signal d are supplied to an AND circuit 11. The output signal e from the AND circuit 11 is supplied to an OR circuit 12. The output signal from the OR circuit 12 is supplied to an ignition circuit 13 which, when the output signal of the OR circuit 12 becomes "1", delivers a short gate trigger current pulse f with a suitable amplitude and duration to the control means 2 of the thyristor. The output signal of the OR circuit 12 is supplied to the R-input of the flip-flop 9 which, when the output signal of the OR circuit becomes "1", is reset to the position where the output signal b of the flip-flop is "0".

The portion of the control unit described above constitutes a recovery protection device for the thyristor T1. The mode of operation of the recovery protection device will now be described with reference to FIG. 3, which shows the thyristor current $i_T$, the thyristor voltage $u_T$ and the signals a–f.

Prior to the time $t=t_1$, the valve and thus the thyristor T1 are current-carrying. The thyristor voltage $u_T$ has a low positive value (the on-state voltage drop) and the signals a–f are "0". At the time $t_1$ a commutation of the current to another valve is started. The thyristor current $i_T$ decreases and passes through zero at the time $t_2$. At the time $t_3$ the thyristor starts taking up reverse blocking voltage. The signal a from the level detector 6 then becomes "1", the flip-flop 9 is set, the signal b becomes "1" and triggers the flip-flop 10, which then delivers the pulse c having the length 1 ms. The length of this pulse defines the interval during which the thyristor has reduced ability to take up off-state voltage without self-ignition.

Figure 3:
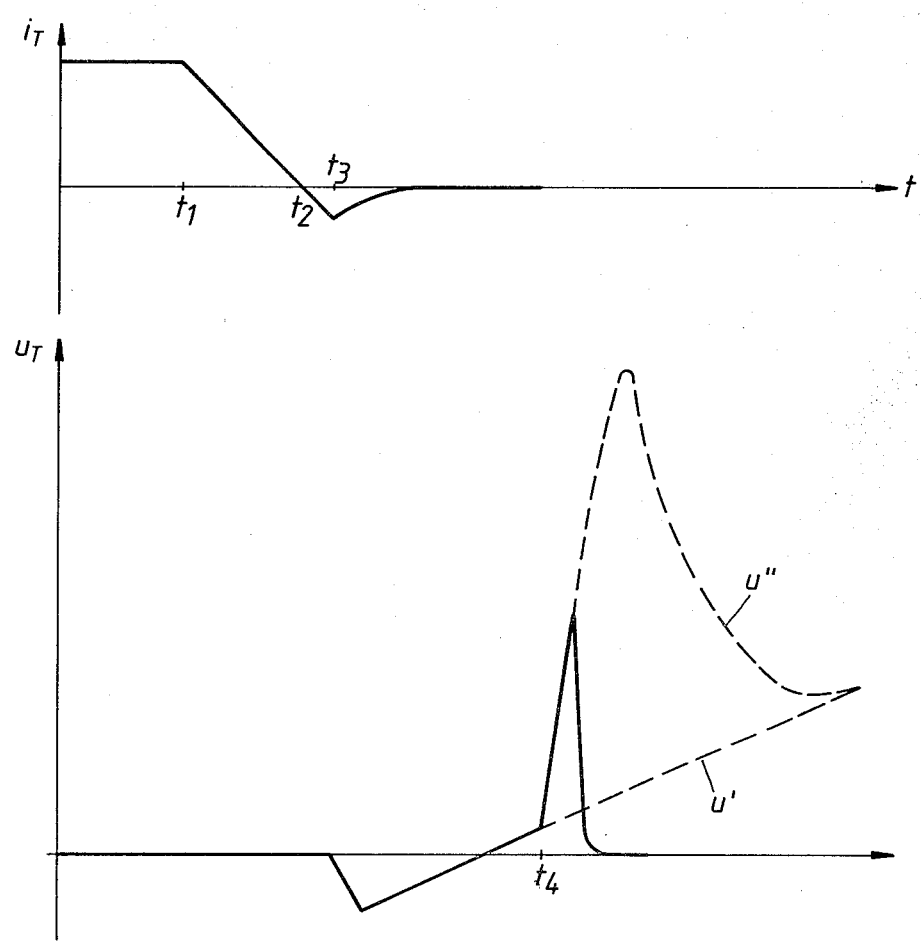
FIG. 3 is a series of graphs showing the current and voltage of the thyristor of FIG. 2 and the signals occurring in its control unit, all as a function of time.
Figure 3:
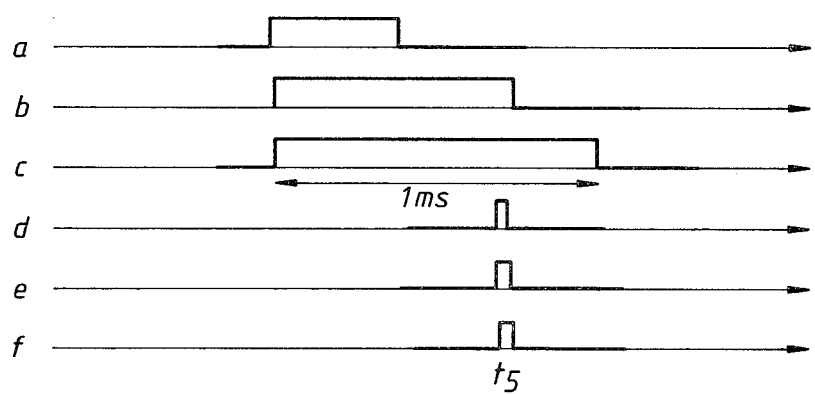

During a typical normal commutation process, the thyristor voltage $u_T$ between the times $t_3$ and $t_4$ would follow the continuous line in FIG. 3 and then the dashed line designated u'. The off-state voltage would then not reach the value 1 kV determined by the detector 5 until after the end of the action interval of the recovery protection device, the thyristor would be able to take up the off-state voltage without any risk of self-ignition, and the recovery protection device would not become effective.

If, on the other hand, the off-state voltage should increase more rapidly, for example because of a transient overvoltage, there would be a risk of self-ignition. Such an overvoltage is shown in FIG. 3, starting at the time $t_4$. The thyristor voltage $u_T$ reaches the switch level (1 kV) of the detector 5 at the time $t_5$, and the signal d becomes "1". Since also the signal c is "1", the output signal e of the AND circuit 11 becomes "1", and the ignition circuit 13 delivers a control current pulse f to the thyristor T1. The thyristor is ignited and the thyristor voltage, which follows the continuous curve in FIG. 3, then rapidly drops to a level corresponding to the on-state voltage drop, i.e. one or a few volts. At the same time, the flip-flop 9 is restored by the output signal from the OR circuit 12.

The control unit S1 also contains circuits for the ordinary periodic ignition of the thyristor. A level detector 8 is arranged in a known manner to emit an output signal h which is "1" if the off-state voltage of the thyristor is greater than a minimum value, for example 50 V, which is required to ensure reliable ignition of the thyristor. A detector 15 receives the control pulses emitted from the control device SD and delivers an output signal j which becomes "1" when a control pulse is received by the detector. The signals h and j are supplied to an AND circuit 14, the output signal k of which is supplied to the OR circuit 12 and triggers an ignition pulse to the thyristor.

To protect the thyristor from self-igniting at too high off-state voltages, a level detector 7 is arranged. It delivers a signal g which becomes "1" if the thyristor voltage $u_T$ becomes greater than a value, for example 4 kV, which is higher than the highest off-state voltage occurring during normal operation. The signal g is supplied to the OR circuit 12 and triggers an ignition pulse to the thyristor.

The above-described recovery protection device according to the invention provides considerable advantages over prior art circuits with the same purpose. Because of differences in the recovery charge of the different thyristors in the valve and because of the tolerances of the voltage divider components, the thyristors in a valve will be subjected to voltage stresses of different magnitudes. Since each thyristor has its own separate recovery protection device, only those thyristors will be ignited on which the voltage stress becomes so great that there will be a risk of damage to the thyristor. Unnecessary firing of the entire valve is therefore avoided.

Since the recovery protection device of each thyristor is positioned in its entirety at the same potential as the thyristor, a considerably increased reliability of operation is obtained as compared with such recovery protection devices which are partially or completely arranged at earth potential. The latter system requires at least two potential-separating transmission channels for each thyristor for transmission of signals from and to the control circuit of the thyristor. These channels may, for example, consist of opto-electronic transmission members, and the light-emitting diodes included in such members have a relatively low reliability of operation and a low service life. In the recovery protection device according to the invention these transmission links are entirely eliminated, which provides a considerably increased reliability of operation. This advantage is of great importance since it is important that the recovery protection device does not fail to ignite its thyristor at an overvoltage to avoid damage to the thyristor. In addition, by avoiding said transmission channels, a more simple and less expensive device is obtained. Furthermore, the signal delays occurring in the transmission channels are avoided, which causes the device to function more rapidly.

In the recovery protection device according to the invention, the protection device (flip-flop 9 in FIG. 2) is restored as soon as an ignition signal is delivered to the thyristor, and thereafter the protection device is immediately ready for renewed action, which is an advantage for certain operating cases.

The embodiment of the invention described with reference to the drawings is only one example of how the invention may be realized. The detailed embodiment of the recovery protection device may be varied within the scope of the ensuing claims, and the times and voltage levels stated may of course be given different values.

What is claimed is:

1. In a thyristor valve having a plurality of series-connected thyristors, an individual recovery protection device for each of said thyristors operating at the potential of a respective thyristor, comprising:

a first voltage sensor for providing a first signal when the reverse voltage across said thyristor exceeds a first reference level;

a second voltage sensor for providing a second signal when the off state voltage across said thyristor exceeds a second reference level;

a bi-stable circuit having a set input connected to receive said first signal, and a reset input;

a monostable circuit connected to receive an input signal from said bi-stable circuit, whereby an output pulse of fixed duration is produced;

an AND circuit having a first input connected to receive said monostable circuit output pulse, and a second input connected to receive a signal from said second voltage sensor;

an OR circuit having a first input connected to receive an output signal from said AND circuit, and a second input for receiving an input signal for simultaneously igniting the thyristors of said valve; said OR circuit providing an output signal to said bi-stable circuit reset input; and means for generating a control signal for igniting said thyristor in response to said OR circuit output signal.

2. The recover protection device according to claim 1, further comprising:

a third voltage sensor for generating an ignition signal when said thyristor off-state voltage exceeds a predetermined value, said ignition signal being connected to a third input of said OR circuit.

* * * * *